US012586611B2

(12) United States Patent
Yamamoto et al.

(10) Patent No.: US 12,586,611 B2
(45) Date of Patent: Mar. 24, 2026

(54) ELECTRONIC DEVICE

(71) Applicants: Kabushiki Kaisha Toshiba, Tokyo (JP); Toshiba Electronic Devices & Storage Corporation, Tokyo (JP)

(72) Inventors: Nobuhiro Yamamoto, Yokohama (JP); Masahide Takazawa, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 231 days.

(21) Appl. No.: 18/118,725

(22) Filed: Mar. 7, 2023

(65) Prior Publication Data

US 2024/0096378 A1 Mar. 21, 2024

(30) Foreign Application Priority Data

Sep. 16, 2022 (JP) ................................. 2022-148577

(51) Int. Cl.
*H05K 1/02* (2006.01)
*G11B 33/12* (2006.01)
(Continued)

(52) U.S. Cl.
CPC ......... *G11B 33/124* (2013.01); *H05K 1/0268* (2013.01); *H05K 1/0326* (2013.01);
(Continued)

(58) Field of Classification Search
CPC .... H05K 3/0061; H05K 1/0268; H05K 3/282; H05K 1/0306; H05K 1/118; H05K 1/147;
(Continued)

(56) References Cited

U.S. PATENT DOCUMENTS

| | | |
|---|---|---|
| 6,154,118 A | 11/2000 | Ishikawa et al. |
| 7,355,127 B2 | 4/2008 | Kusukawa et al. |

(Continued)

FOREIGN PATENT DOCUMENTS

| | | |
|---|---|---|
| JP | S53103159 U | 8/1978 |
| JP | S53107153 U | 8/1978 |

(Continued)

OTHER PUBLICATIONS

Office Action mailed Sep. 16, 2025 in corresponding Japanese Patent Application No. 2022-148577, with English machine translation, 18 pages.

*Primary Examiner* — Timothy J Thompson
*Assistant Examiner* — Aditya Sharma
(74) *Attorney, Agent, or Firm* — Kim & Stewart LLP

(57) ABSTRACT

According to one embodiment, an electronic device includes a wall and a substrate. The substrate is provided with an opening. The substrate includes an organic compound layer, a first surface of the organic compound layer, a second surface of the organic compound layer opposite the first surface, first wiring on the second surface, second wiring on the second surface, a first pad, and a second pad. The first surface is attached to the wall. The first pad is connected to the first wiring. The second pad is connected to the second wiring away from the first pad. The opening penetrates the organic compound layer to open to the first surface and the second surface between the first pad and the second pad.

12 Claims, 10 Drawing Sheets

(51) Int. Cl.
  *H05K 1/03*          (2006.01)
  *H05K 1/09*          (2006.01)

(52) U.S. Cl.
  CPC ............. *H05K 1/0346* (2013.01); *H05K 1/09*
      (2013.01); *H05K 2201/0145* (2013.01); *H05K*
        *2201/0154* (2013.01); *H05K 2201/0347*
      (2013.01); *H05K 2201/09063* (2013.01); *H05K*
        *2201/094* (2013.01); *H05K 2201/0949*
                                (2013.01)

(58) Field of Classification Search
  CPC ... H05K 1/189; H05K 2201/05; G11B 33/124
  See application file for complete search history.

(56)                    References Cited

U.S. PATENT DOCUMENTS

2008/0118200 A1*   5/2008   Kim ..................... H05K 1/0274
                                                      385/14
2010/0165657 A1*   7/2010   Lee ........................ H05K 1/028
                                                     174/254
2020/0305280 A1*   9/2020   Tokuda .................. H05K 1/118

FOREIGN PATENT DOCUMENTS

| JP | S6464285 | A | 3/1989 |
|----|----------|----|--------|
| JP | H01-076070 | U1 | 5/1989 |
| JP | H0677622 | A | 3/1994 |
| JP | H11355961 | A | 12/1999 |
| JP | 2000-183468 | A | 6/2000 |
| JP | 2003-332483 | A | 11/2003 |
| JP | 2005011867 | A | 1/2005 |
| JP | 2014207275 | A | 10/2014 |

* cited by examiner

ELECTRONIC DEVICE

CROSS-REFERENCE TO RELATED APPLICATIONS

This application is based upon and claims the benefit of priority from Japanese Patent Application No. 2022-148577, filed on Sep. 16, 2022 the entire contents of which are incorporated herein by reference.

FIELD

Embodiments described herein relate generally to an electronic device.

BACKGROUND

Electronic devices typically include, for example, a substrate such as a flexible printed circuit board. The substrate is provided with a plurality of pads. The pads are joined to a terminal of an electronic component with, for example, solder or a conductive adhesive, or are temporarily pressed against a compression connector of an inspection device.

The pads contain metal. The metal may be corroded and ionized along the surface of the substrate. Such corroded metal may electrically connect the adjacent pads, possibly causing a short circuit in the circuitry on the substrate. In this regard, setting a longer creepage distance between the adjacent pads may lead to delaying occurrence of a short circuit between the adjacent pads.

DETAILED DESCRIPTION

In general, according to one embodiment, an electronic device includes a wall and a substrate. The substrate is provided with an opening. The substrate includes an organic compound layer, a first surface of the organic compound layer, a second surface of the organic compound layer opposite the first surface, first wiring on the second surface, second wiring on the second surface, a first pad, and a second pad. The first surface is attached to the wall. The first pad is connected to the first wiring. The second pad is connected to the second wiring away from the first pad. The opening penetrates the organic compound layer to open to the first surface and the second surface between the first pad and the second pad.

First Embodiment

Hereinafter, a first embodiment will be described with reference to FIGS. 1 to 8. Note that, in the present specification, components according to embodiments and descriptions of the components may be described in a plurality of expressions. The components and the descriptions thereof are examples, and are not limited by the expression of the present specification. The components may also be identified with names different from those herein. In addition, the component may be described by an expression different from the expression in the present specification.

Figure 1:
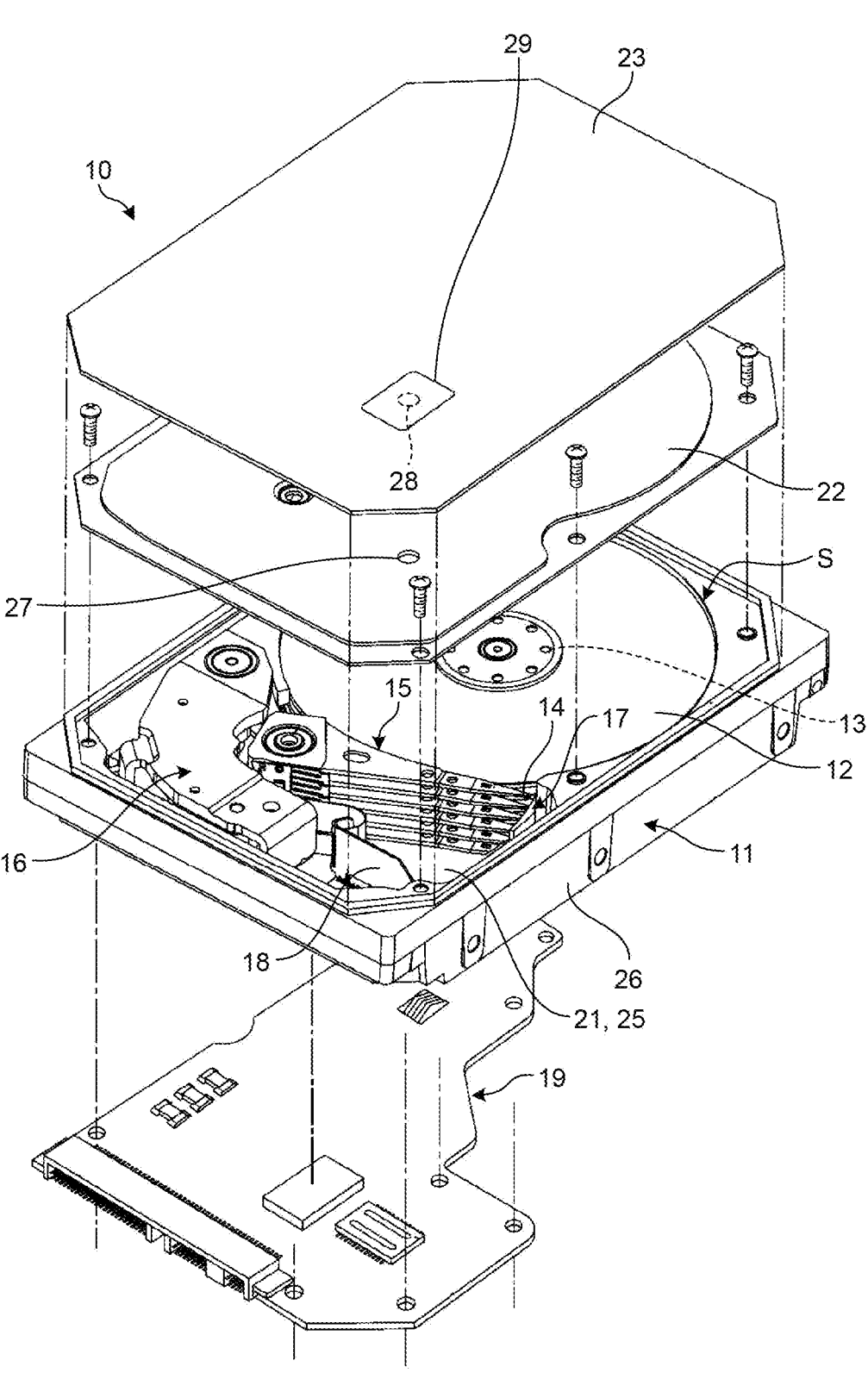
FIG. 1 is an exemplary perspective view illustrating a hard disk drive (HDD) according to a first embodiment in an exploded manner.

FIG. 1 is an exemplary perspective view illustrating a hard disk drive (HDD) 10 according to the first embodiment in an exploded manner. The HDD 10 is an example of an electronic device, and may also be referred to as a storage device, an external storage device, a disk device, or a magnetic disk device. Note that the electronic device is not limited to the HDD 10, and may be another device.

As illustrated in FIG. 1, the HDD 10 includes a housing 11, a plurality of magnetic disks 12, a spindle motor 13, a plurality of magnetic heads 14, a head stack assembly (HSA) 15, a voice coil motor (VCM) 16, a ramp load mechanism 17, an internal flexible printed circuit board (FPC) 18, and a printed circuit board (PCB) 19. The spindle motor 13 is an example of an electric component. The magnetic head 14 and the internal FPC 18 may be included in the HSA 15.

The housing 11 includes a base 21, an inner cover 22, and an outer cover 23. Note that the housing 11 is not limited to this example. The base 21 has a substantially rectangular parallelepiped box shape having the inner chamber S inside. The inner chamber S is opened to the outside of the base 21. The housing 11 accommodates the plurality of magnetic disks 12, the spindle motor 13, the plurality of magnetic heads 14, the HSA 15, the VCM 16, the ramp load mechanism 17, and the internal FPC 18 in the inner chamber S.

The base 21 has a bottom wall 25 and a side wall 26. The bottom wall 25 is an example of a wall. The bottom wall 25 has a substantially rectangular (quadrangular) plate shape. The side wall 26 protrudes from the edge of the bottom wall 25 and has a substantially rectangular frame shape. The bottom wall 25 and the side wall 26 are integrally formed. The inner cover 22 is attached to an end of the side wall 26 with, for example, screws to close the inner chamber S. The outer cover 23 is attached to the end of the side wall 26 by welding, for example, to cover the inner cover 22.

The inner cover 22 is provided with a vent 27. Further, the outer cover 23 is provided with a vent 28. After the components are attached to the inside of the base 21 and the inner cover 22 and the outer cover 23 are attached to the base 21, the air inside the housing 11 is removed from the vents 27 and 28. Furthermore, the housing 11 is filled with a gas different from air.

The gas filling the housing 11 is, for example, a low density gas having a density lower than that of air, an inert gas having low reactivity, or the like. For example, the housing 11 is filled with helium inside. Note that the housing 11 may be filled with another fluid inside. Further, the inside of the housing 11 may be maintained at vacuum, low pressure close to vacuum, or negative pressure lower than atmospheric pressure.

The vent 28 of the outer cover 23 is closed by a seal 29. The seal 29 airtightly seals the vent 28 and prevents the fluid from leaking from the housing 11 through the vent 28.

The plurality of magnetic disks 12 is stacked on top of each other at intervals. The spindle motor 13 rotates the plurality of magnetic disks 12. The plurality of magnetic disks 12 is held by the hub of the spindle motor 13 by, for example, a clamp spring.

Each of the plurality of magnetic heads 14 records and reproduces information on and from a corresponding one of the plurality of magnetic disks 12. In other words, each of the plurality of magnetic heads 14 reads and writes information from and to one of the plurality of magnetic disks 12.

The plurality of magnetic heads 14 is mounted on the HSA 15. The VCM 16 rotates the HSA 15 to place the HSA 15 at a desired position. When the magnetic head 14 reaches the outermost periphery of the magnetic disk 12 by the rotation of the HSA 15 by the VCM 16, the ramp load mechanism 17 holds the magnetic head 14 at a position separated from the magnetic disk 12.

One end of the internal FPC 18 is electrically connected to the magnetic head 14 via the HSA 15. The other end of the internal FPC 18 is connected to, for example, a connector mounted on the bottom wall 25.

The PCB 19 is, for example, a rigid board such as a glass epoxy board, and is a multilayer board, a build-up board, or the like. The PCB 19 is disposed outside the housing 11 and is attached to the bottom wall 25.

Various electronic components such as a relay connector connected to the internal FPC 18, an interface (I/F) connector connected to a host computer, and a controller that controls the operation of the HDD 10 are mounted on the PCB 19. The relay connector is electrically connected to the internal FPC 18 via a connector mounted on the bottom wall 25.

Figure 2:
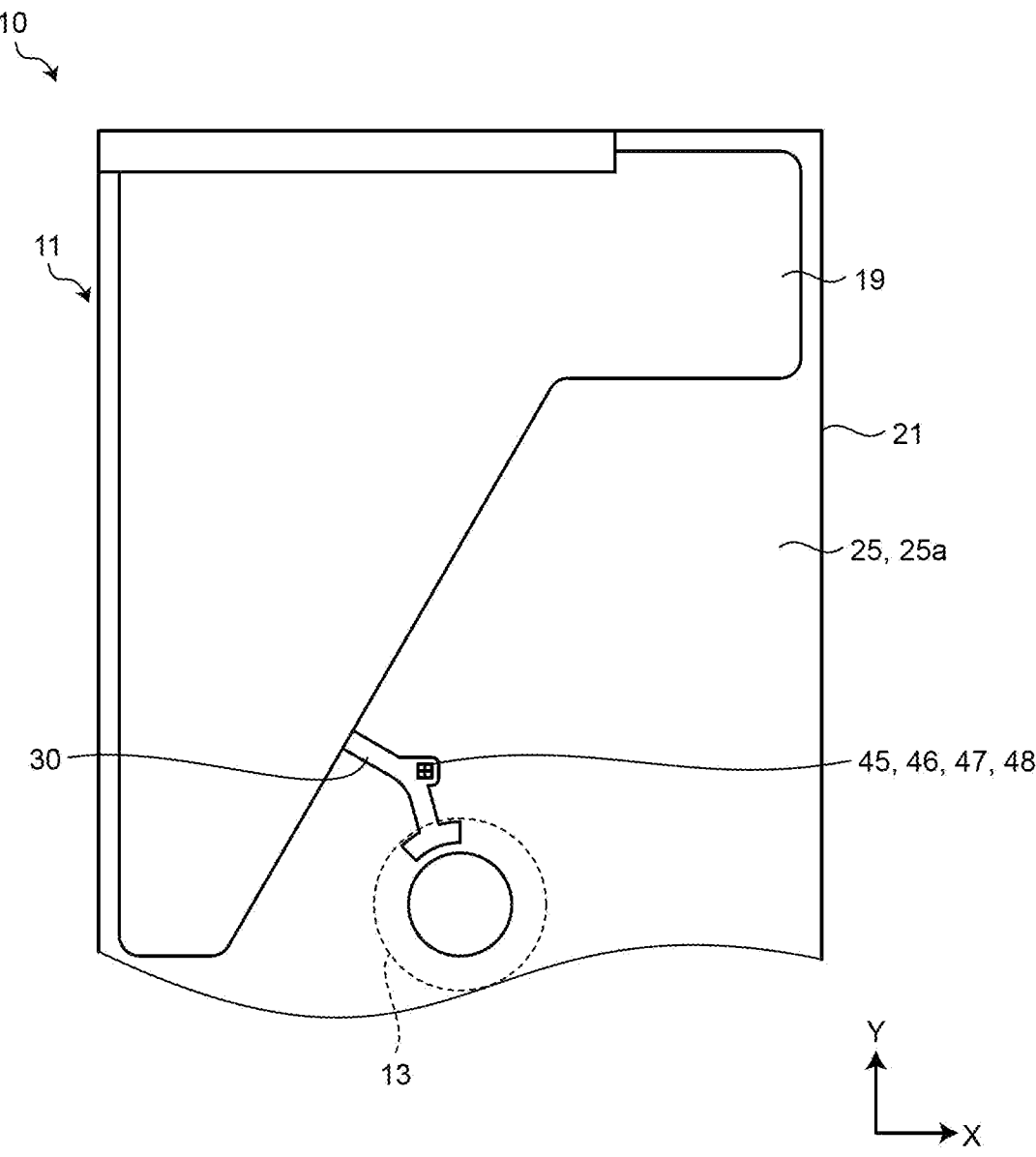
FIG. 2 is an exemplary bottom view illustrating a part of the HDD according to the first embodiment.

FIG. 2 is an exemplary bottom view illustrating a part of the HDD 10 according to the first embodiment. As illustrated in FIG. 2, the HDD 10 further includes an external FPC 30. The external FPC 30 is an example of a substrate. Note that the substrate is not limited to the FPC, and may be another substrate such as a PCB.

The external FPC 30 is disposed outside the housing 11 and is attached to the bottom wall 25. The external FPC 30 electrically connects the spindle motor 13 and the PCB 19. For example, the host computer supplies power to the spindle motor 13 via the PCB 19 and the external FPC 30.

Figure 3:
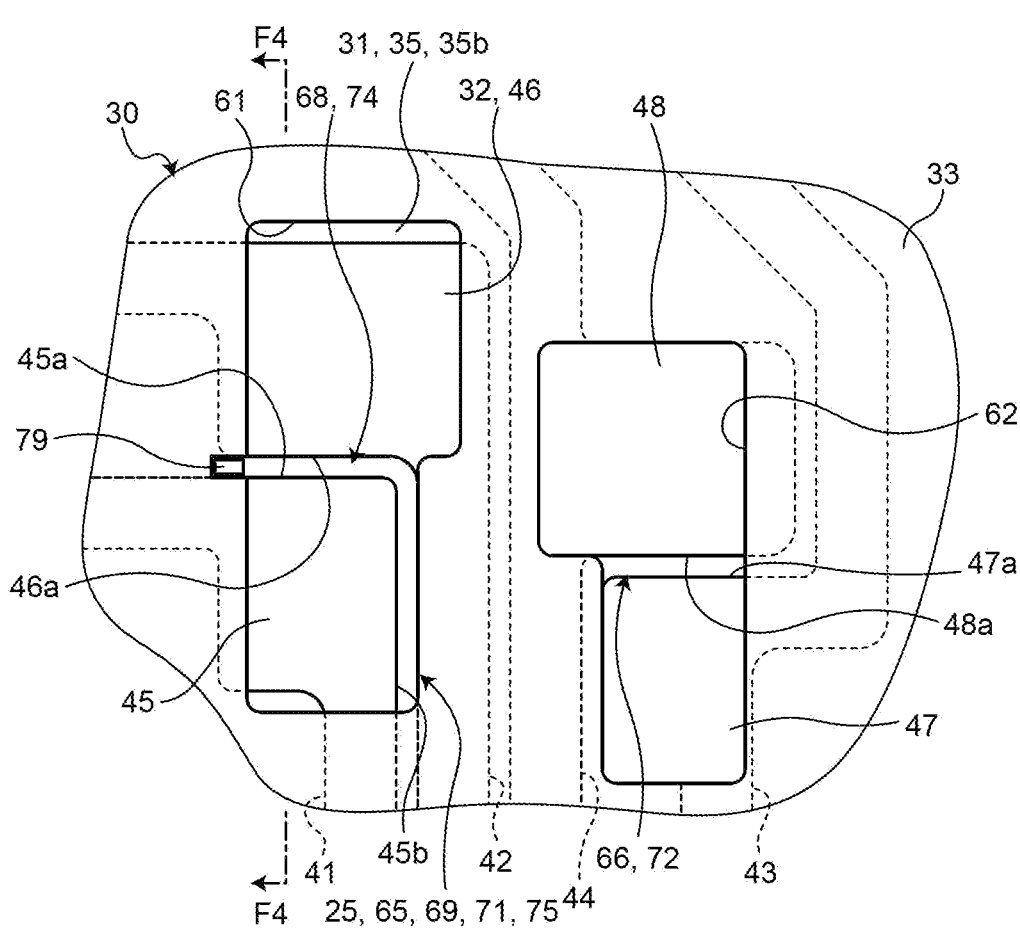
FIG. 3 is an exemplary plan view illustrating a part of an external FPC of the first embodiment.
Figure 3:
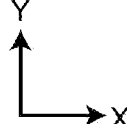
Figure 4:
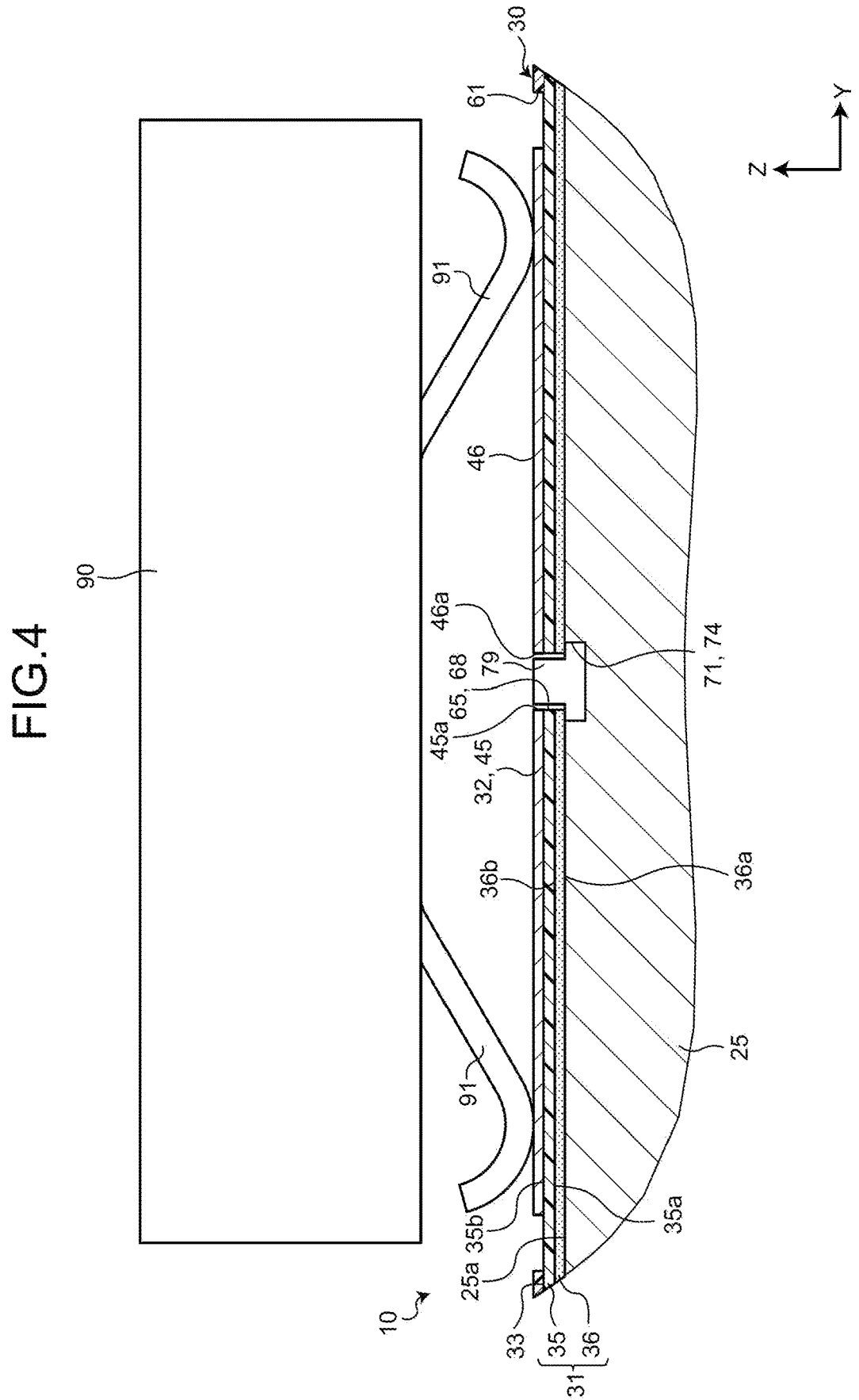
FIG. 4 is an exemplary cross-sectional view illustrating a part of the HDD of the first embodiment taken along line F4-F4 of FIG. 3.

FIG. 3 is an exemplary plan view illustrating a part of the external FPC 30 of the first embodiment. FIG. 4 is an exemplary cross-sectional view illustrating a part of the HDD 10 of the first embodiment taken along line F4-F4 of FIG. 3. As illustrated in the drawings, in the present specification, an X axis, a Y axis, and a Z axis are defined for convenience. The X axis, the Y axis, and the Z axis are orthogonal to each other. The Z axis is along the thickness of the external FPC 30.

Furthermore, in the present specification, an X direction, a Y direction, and a Z direction are defined. The X direction is a direction along the X axis and includes a +X direction indicated by an arrow of the X axis and a −X direction which is an opposite direction of the arrow of the X axis. The Y direction is a direction along the Y axis and includes a +Y direction indicated by an arrow of the Y axis and a −Y direction which is an opposite direction of the arrow of the Y axis. The Z direction is a direction along the Z axis and includes a +Z direction indicated by an arrow of the Z axis and a −Z direction which is an opposite direction of the arrow of the Z axis.

As illustrated in FIG. 4, the bottom wall 25 of the base 21 has an outer surface 25a. The outer surface 25a is located outside the housing 11 and is separated from the inner chamber S by the bottom wall 25. The outer surface 25a is substantially flat, for example, and faces in the substantially +Z direction. Note that the outer surface 25a may have irregularities.

The external FPC 30 is attached to the outer surface 25a of the bottom wall 25. The external FPC 30 includes an organic compound layer 31, a conductive layer 32, and a cover layer 33. Note that the external FPC 30 is not limited to this example.

Figure 5:
FIG. 5 is an exemplary cross-sectional view illustrating a part of a bottom wall and a part of an external FPC of the first embodiment.

FIG. 5 is an exemplary cross-sectional view illustrating a part of the bottom wall 25 and a part of the external FPC 30 of the first embodiment. As illustrated in FIG. 5, the organic compound layer 31 includes a base layer 35 and an adhesive layer 36. The base layer 35 is an example of an insulator layer.

The base layer 35 is, for example, an insulating film made of a synthetic resin such as polyimide or polyester. The base layer 35 has a lower surface 35a and an upper surface 35b. The upper surface 35b is an example of a second surface. Note that in this disclosure the terms, "upper" and "lower" are defined with reference to FIGS. 4 and 5 for convenience, and are not intended to limit position or location, direction or orientation, usage mode, and other conditions.

The lower surface 35a is substantially flat and faces substantially in the −Z direction. The lower surface 35a faces the outer surface 25a of the bottom wall 25 via the adhesive layer 36. The upper surface 35b is opposite the lower surface 35a. The upper surface 35b is substantially flat and faces substantially in the +Z direction.

The adhesive layer 36 is, for example, an epoxy resin-based adhesive. The adhesive layer 36 is interposed between the outer surface 25a of the bottom wall 25 and the lower surface 35a of the base layer 35. The adhesive layer 36 has a lower surface 36a and an upper surface 36b. The lower surface 36a is an example of a first surface.

The lower surface 36a is substantially flat and faces substantially in the −Z direction. The lower surface 36a adheres to the outer surface 25a of the bottom wall 25. The upper surface 36b is opposite the lower surface 36a. The upper surface 36b is substantially flat and faces substantially in the +Z direction. The upper surface 36b adheres to the lower surface 35a of the base layer 35. That is, the adhesive layer 36 adheres the lower surface 35a of the base layer 35 to the outer surface 25a of the bottom wall 25.

The upper surface 35b of the base layer 35 and the lower surface 36a of the adhesive layer 36 are not covered with the other layers of the organic compound layer 31, and form the surface of the organic compound layer 31. The upper surface 35b is at an end of the organic compound layer 31 in the +Z direction. The lower surface 36a is at an end of the organic compound layer 31 in the −Z direction. In the entire organic compound layer 31, the upper surface 35b is opposite the lower surface 36a.

The external FPC 30 may be a multilayer substrate. That is, the organic compound layer 31 may further include a plurality of layers interposed between the base layer 35 and the adhesive layer 36. For example, a plurality of base layers and a plurality of adhesive layers may be provided between the base layer 35 and the adhesive layer 36, and wiring may be provided on the plurality of base layers. Furthermore, a through holes may be provided in the plurality of base layers.

The conductive layer 32 is formed on the upper surface 35*b* of the base layer 35. There may be an additional adhesive layer between the base layer 35 and the conductive layer 32. As illustrated in FIG. 3, the conductive layer 32 includes a plurality of wires 41, 42, 43, and 44 and a plurality of pads 45, 46, 47, and 48. The wire 41 is an example of first wiring. The wire 42 is an example of second wiring. The pad 45 is an example of a first pad. The pad 46 is an example of a second pad.

Each of the plurality of wires 41, 42, 43, and 44 electrically connects the spindle motor 13 and the PCB 19. For example, the spindle motor 13 is a three-phase motor, and is supplied with electric power through the plurality of wires 41, 42, and 43.

The pad 45 is connected to the wire 41. The pad 46 is connected to the wire 42. The pad 47 is connected to the wire 43. The pad 48 is connected to the wire 44. The plurality of pads 45, 46, 47, and 48 are away from one another.

The pads 45 and 46 are adjacent to each other in the Y direction. The pad 46 is away from the pad 45 in the +Y direction. The +Y direction is a direction along the upper surface 35*b* and is an example of a second direction.

The pads 47 and 48 are adjacent to each other in the Y direction. Furthermore, the pads 47 and 48 and the pads 45 and 46 are adjacent to each other in the X direction. The pad 47 is separated from the pad 45 in the +X direction. The pad 48 is separated from the pad 46 in the +X direction and is separated from the pad 47 in the +Y direction.

Each of the pads 45, 46, 47, and 48 has a substantially rectangular shape. Note that the shape of the pads 45, 46, 47, and 48 is not limited to this example. The substantially rectangular pads 45, 46, 47, and 48 have, for example, four linear edges being the four sides of a rectangle.

The pad 45 has edges 45*a* and 45*b*. The edge 45*a* is one of the four edges of the pad 45 and is an example of a first edge. The edge 45*a* extends linearly in the X direction (+X direction and −X direction) and faces in the +Y direction. The −X direction is a direction along the upper surface 35*b* and is an example of the first direction. The edge 45*a* of the pad 45 faces the pad 46 with a gap.

The edge 45*b* of the pad 45 is another one of the four edges of the pad 45. The edge 45*b* extends linearly in the −Y direction from an end of the edge 45*a* in the +X direction and faces in the +X direction. The edge 45*b* of the pad 45 faces the wire 42 with a gap.

The pad 46 has an edge 46*a*. The edge 46*a* is one of the four edges of the pad 46 and is an example of a second edge. The edge 46*a* extends linearly in the X direction and faces in the −Y direction. The edge 46*a* faces the edge 45*a* of the pad 45 with a gap.

The pad 47 has an edge 47*a*. The edge 47*a* is one of the four edges of the pad 47. The edge 47*a* extends linearly in the X direction and faces in the +Y direction. The pad 48 has an edge 48*a*. The edge 48*a* is one of the four edges of the pad 48. The edge 48*a* extends linearly in the X direction and faces the −Y direction. The edge 47*a* and the edge 48*a* face each other with a gap therebetween.

As illustrated in FIG. 5, each of the pads 45, 46, 47, and 48 includes a metal layer 51 and gold plating 52. The metal layer 51 of the pad 45 is an example of a first metal layer. The gold plating 52 of the pad 45 is an example of first gold plating. The metal layer 51 of the pad 46 is an example of a second metal layer. The gold plating 52 of the pad 46 is an example of second gold plating.

The metal layers 51 are integrally formed of copper with the corresponding wires 41, 42, 43, and 44. The metal layers 51 of the pads 45, 46, 47, and 48 are formed on the upper surface 35*b* of the base layer 35 and connected to the corresponding wires 41, 42, 43, and 44. Note that the metal layers 51 may contain nickel. The gold plating 52 covers the metal layers 51.

The cover layer 33 in FIG. 4 is, for example, an insulating film made of a synthetic resin such as polyimide or polyester. The cover layer 33 covers the upper surface 35*b* of the base layer 35 and the wires 41, 42, 43, and 44. The cover layer 33 may cover a part of the pads 45, 46, 47, and 48.

As illustrated in FIG. 3, the cover layer 33 is provided with a plurality of exposure holes 61 and 62. The exposure holes 61 and 62 penetrate the cover layer 33 substantially in the Z direction. The exposure hole 61 exposes at least a part of the pads 45 and 46 and a part of the upper surface 35*b* of the cover layer 33 to the outside of the external FPC 30.

The exposure hole 62 is separated from the exposure hole 61. The exposure hole 62 exposes at least a part of the pads 47 and 48 and the other part of the upper surface 35*b* of the cover layer 33 to the outside of the external FPC 30.

The organic compound layer 31 is provided with a plurality of openings 65 and 66. The openings 65 and 66 may also be referred to as cavities, holes, grooves, slits, or through holes, for example. As illustrated in FIG. 5, the openings 65 and 66 penetrate the organic compound layer 31 in the substantially Z direction and open to the upper surface 35*b* and the lower surface 36*a*, respectively. That is, the openings 65 and 66 both penetrate the base layer 35 and the adhesive layer 36.

The opening 65 opens to the upper surface 35*b* between the pad 45 and the pad 46. The opening 65 is adjacent to the pads 45 and 46. As illustrated in FIG. 3, the opening 65 of the present embodiment has a substantially L shape having two parts 68 and 69. A first part 68 extends in the X direction between the entire edge 45*a* of the pad 45 and at least a part of the edge 46*a* of the pad 46. Further, a second part 69 extends in the Y direction between the entire edge 45*b* of the pad 45 and a part of the wire 42. Note that the opening 65 is not limited to this example. The opening 66 extends in the X direction between the edge 47*a* of the pad 47 and the edge 48*a* of the pad 48.

As illustrated in FIG. 5, the width of the first part 68 of opening 65 is substantially equal to the distance between the pads 45 and 46. The edge 68*a* of the first part 68 is disposed at substantially the same position in the Y direction as the edge 45*a* of the pad 45 and the edge 46*a* of the pad 46. The width of the first part 68 may be shorter than the distance between the pads 45 and 46.

The opening 65 is exposed to the outside of the external FPC 30 through the exposure hole 61. In other words, the opening 65 communicates with the exposure hole 61. The opening 66 is exposed to the outside of the external FPC 30 through the exposure hole 62. In other words, the opening 66 communicates with the exposure hole 62.

As illustrated in FIG. 3, the outer surface 25*a* of the bottom wall 25 are provided with holes 71 and 72. As illustrated in FIG. 5, the holes 71 and 72 are recessed in a substantially −Z direction from the outer surface 25*a*. The holes 71 and 72 do not penetrate the bottom wall 25 and are bottomed recesses. Thus, the holes 71 and 72 do not allow the inner chamber S of the housing 11 to communicate with the outside.

As illustrated in FIG. 3, in the present embodiment, the hole 71 has a substantially L shape having two parts 74 and 75. A first part 74 extends in the X direction between the entire edge 45a of the pad 45 and at least a part of the edge 46a of the pad 46. Further, a second part 75 extends in the Y direction between the entire edge 45b of the pad 45 and a part of the wire 42.

As illustrated in FIG. 5, the hole 71 communicates with the opening 65. The first part 74 of the hole 71 communicates with the first part 68 of the opening 65. The second part 75 of the hole 71 communicates with the second part 69 of the opening 65. The hole 72 communicates with the opening 66.

In the Y direction (+Y direction), the first part 74 of the hole 71 is longer in length (width) than the first part 68 of the opening 65. Thus, the first part 74 of the hole 71 has recesses 77 and 78 recessed in the Y direction from the edge 68a of the first part 68 of the opening 65. The recess 77 is recessed from the edge 68a in the −Y direction. The recess 78 is recessed from the edge 68a in the +Y direction.

In the X direction, the second part 75 of the hole 71 is longer in length than the second part 69 of the opening 65. In the Y direction, the hole 72 is longer in length than the opening 66. Note that the hoes 71 and 72 are not limited to this example.

In the Z direction, the length (depth) of the hole 71 is longer than the length (thickness) of the adhesive layer 36. In addition, the depth of the hole 71 is longer than the thickness of the base layer 35 in the Z direction. On the other hand, in the Z direction, the depth of the hole 71 is the same as or slightly shorter than the thickness of the organic compound layer 31.

For example, the depth of the hole 71 is about 37 μm, the thickness of the base layer 35 is about 20 μm, and the thickness of the adhesive layer 36 is about 18 μm. Further, the thickness of the conductive layer 32 is about 18 μm. Note that each dimension is not limited to this example.

As illustrated in FIG. 3, the base 21 further includes a protrusion 79. The protrusion 79 is an example of a first protrusion. The protrusion 79 protrudes substantially in the +Z direction from the outer surface 25a of the bottom wall 25. The protrusion 79 is inserted into the opening 65 of the organic compound layer 31.

The protrusion 79 is separated from the edges 45a and 46a of the pads 45 and 46 in the X direction (−X direction). For example, the first part 68 of the opening 65 extends in the region between the pads 45 and 46 in the −X direction to outside the region. The protrusion 79 is inserted into the outside portion of the first part 68.

The width of the protrusion 79 is slightly shorter than the width of the first part 68. Thus, the protrusion 79 can protrude from the bottom wall 25 through the first part 68. The shape of the protrusion 79 may be a rectangular parallelepiped, a cylinder, or another shape. For example, the protrusion 79 positions the external FPC 30 with respect to the bottom wall 25 in the assembly of the HDD 10.

As illustrated in FIG. 5, the base 21 has a base 81 and a coating 82. The base 81 is made of a metal material such as an aluminum alloy. The coating 82 is an insulating paint and covers the base 81. The coating 82 forms the surface of the protrusion 79. Therefore, even if the protrusion 79 comes into contact with the pads 45 and 46, it is possible to prevent occurrence of a short circuit.

As illustrated in FIG. 4, for example, an inspection device 90 is used to inspect the supply of electric power to the spindle motor 13. The inspection device 90 includes a plurality of compression connectors 91. The plurality of compression connectors 91 are, for example, gold-plated metal terminals and are elastically deformable.

In the inspection, the plurality of compression connectors 91 is in contact with at least two of the pads 45, 46, 47, and 48 and is electrically connected to the corresponding wires 41, 42, 43, and 44. As a result, the inspection device 90 inspects, for example, the energized state between the spindle motor 13 and the PCB 19 via the wires 41, 42, 43, and 44. The bottom wall 25 supports the external FPC 30 against which the compression connector 91 is pressed.

The pads 45, 46, 47, and 48 are disposed at positions corresponding to the compression connector 91 of the inspection device 90. The compression connector 91 contacts substantially the centers of the corresponding pads 45, 46, 47, and 48. The protrusion 79 is away from the centers of the pads 45, 46, 47, and 48, therefore, it can be avoided from interfering with the compression connector 91.

As described above, the pads 45, 46, 47, and 48 of the present embodiment are provided to temporarily contact with the compression connectors 91 of the inspection device 90. Therefore, the pads 45, 46, 47, and 48 have no components mounted thereon and are not covered with solder. Note that the pads 45, 46, 47, and 48 are not limited to this example, and components may be mounted thereon.

Figure 6:
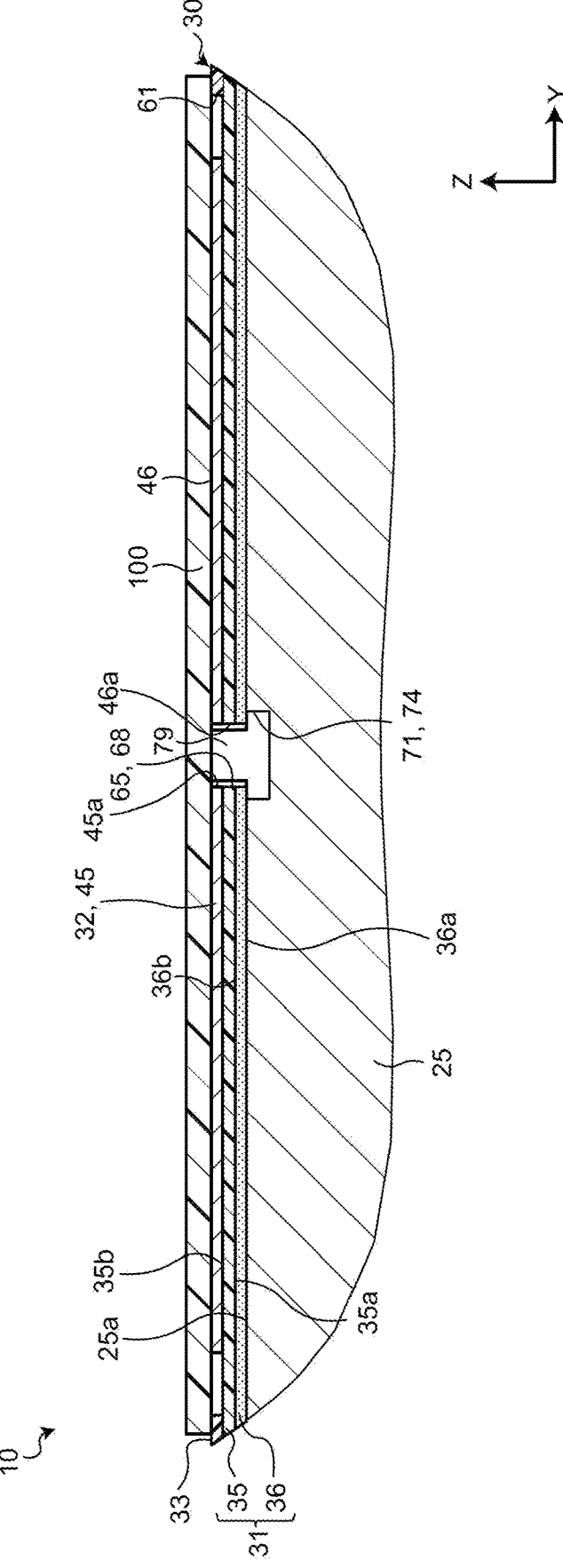
FIG. 6 is an exemplary cross-sectional view illustrating a pad covered with a cover of the first embodiment.

FIG. 6 is an exemplary cross-sectional view illustrating the pads 45 and 46 covered with a cover 100 of the first embodiment. As illustrated in FIG. 6, the HDD 10 may further include the cover 100. The cover 100 covers the pads 45, 46, 47, and 48 to protect the pads 45, 46, 47, and 48 from corrosion and short circuits.

The cover 100 is, for example, a tape attached to the external FPC 30 or a coating layer included in the external FPC 30. After completion of the inspection by the inspection device 90, the pads 45, 46, 47, and 48 are covered by the cover 100.

Organic compounds are generally more hygroscopic than metals. For example, in a high-humidity environment, moisture may condense into a film on the surface of the organic compound layer 31. Such moisture may corrode the exposed pads 45, 46, 47, and 48. For example, creep corrosion may occur on the pads 45, 46, 47, and 48, as follows.

As described above, in the pads 45, 46, 47, and 48 of the present embodiment, the gold plating 52 covers the metal layer 51. However, the gold plating 52 has defective holes (pinholes). Further, copper as a material of the metal layer 51 has a stronger ionization tendency than gold as a material of the gold plating 52. Therefore, the metal of the metal layer 51 may corrode and ionize due to the anode reaction.

The ionized metal of the metal layer 51 advances to the outside through, for example, the pinholes of the gold plating 52. The ionized metal progresses along the surface of the external FPC 30 and around the pads 45, 46, 47, and 48. The ionized metals of the metal layers 51 may be connected together between the pads 45 and 46, causing a short circuit in the pads 45 and 46.

As illustrated in FIG. 5, the opening 65 and the hole 71 increase the creepage distance DC between the pads 45 and 46. The creepage distance DC in the present embodiment is the sum of twice the depth of the opening 65 in the Z direction, the difference between the length of the hole 71 and the length of the opening 65 in the Y direction, twice the depth of the hole 71 in the Z direction, and the length of the hole 71 in the Y direction. Note that the creepage distance DC is not limited to this example.

The creepage distance DC in the present embodiment is longer than the clearance CL between the pads 45 and 46. The clearance CL is substantially equal to the creepage distance between the pads 45 and 46 when the opening 65 and the hole 71 are not provided. In the present embodiment, the creepage distance DC is twice or more the clearance CL. For example, the creepage distance DC is longer than the clearance CL by 150 μm or more.

Similarly, the opening 65 and the hole 71 increase the creepage distance between the pad 45 and the wire 42. Since the wire 42 is covered with the cover layer 33, it is less likely to corrode than the pads 45, 46, 47, and 48. Furthermore, the opening 66 and the hole 72 also similarly increase the creepage distance between the pads 47 and 48.

Since the creepage distance DC is longer than the clearance CL, even if creep corrosion occurs in the pads 45, 46, 47, and 48, the period until the ionized metal of the metal layer 51 is connected between the pads 45 and 46 becomes long. Therefore, in the HDD 10, the period until the occurrence of the short-circuit failure of the pads 45, 46, 47, and 48 due to the creep corrosion can be extended, and the product life can be extended. The pads 45, 46, 47, and 48 covered by the cover 100 are less likely to corrode.

The recesses 77 and 78 recessed from the edge 68a of the opening 65 work to hinder the ionized metal from progressing beyond the end of the edge 68a in the −Z direction. In other words, the recesses 77 and 78 prevent the progress of the corroded metal between the pads 45 and 46.

By forming the openings 65 and 66, a part of the organic compound layer 31 having high hygroscopicity can be removed in the vicinity of the pads 45, 46, 47, and 48. Therefore, moisture is less likely to condense in the vicinity of the pads 45, 46, 47, and 48, so that the pads 45, 46, 47, and 48 are less likely to corrode.

An insulating coating 82 on the base 21 forms the inner surface of the holes 71 and 72. Therefore, the coating 82 can prevent short-circuiting between the base 21 and the pads 45, 46, 47, and 48 even when ionized metal comes into contact with the inner surfaces of the holes 71 and 72.

In the HDD 10 according to the first embodiment described above, the external FPC 30 includes the organic compound layer 31, the wires 41 and 42, and the pads 45 and 46. The lower surface 36a of the organic compound layer 31 adheres to the bottom wall 25. The wires 41 and 42 run on the upper surface 35b of the organic compound layer 31. The pad 45 is connected to the wire 41. The pad 46 is connected to the wire 42 away from the pad 45. The external FPC 30 is provided with the opening 65 that penetrates the organic compound layer 31 to open to the lower surface 36a and the upper surface 35b between the pads 45 and 46. As a result, the HDD 10 of the present embodiment enables an increase in the creepage distance DC between the pads 45 and 46 as compared with the one including the external FPC 30 without the opening 65.

Under a high-humidity environment, typically, moisture around the external FPC 30 may condense in the organic compound layer 31, for example, causing creep corrosion of the metal of the pads 45 and 46.

Specifically, the corroded metal may be ionized along the surface of the organic compound layer 31. Such corroded metal may electrically connect the pads 45 and 46, possibly resulting in a short circuit between the pads 45 and 46.

In the present embodiment, the creepage distance DC between the pads 45 and 46 can be set to a longer distance. As such, the HDD 10 of the present embodiment can delay occurrence of a short circuit between the pads 45 and 46 which may be caused by corroded metal due to creep corrosion on the pads 45 and 46. As a result, the HDD 10 can have a longer product lifetime.

The external FPC 30 includes the cover layer 33 that covers the upper surface 35b and the wires 41 and 42. The cover layer 33 is provided with the exposure hole 61 from which the pads 45 and 46 and the opening 65 are exposed to the outside of the external FPC 30. That is, the pads 45 and 46 and the opening 65 are located in the region exposed by the one exposure hole 61. The clearance CL between the pads 45 and 46 may be shorter in this exposed region. However, the HDD 10 according to the present embodiment enables a longer creepage distance DC between the pads 45 and 46. As such, the HDD 10 of the present embodiment can delay occurrence of a short circuit between the pads 45 and 46 which may be caused by corroded metal due to creep corrosion on the pads 45 and 46. Thereby, the HDD 10 of the present embodiment can have a longer product lifetime.

The pad 45 extends in the +X direction and the −X direction along the upper surface 35b and has the edge 45a facing the pad 46. The pad 46 extends in the +X direction and the −X direction and has the edge 46a facing the edge 45a. The opening 65 extends between the entire edge 45a and at least part of the edge 46a. Owing to such an opening, the HDD 10 according to the present embodiment can avoid a partial decrease in the creepage distance DC between the edges 45a and 46a, which would otherwise occur in the region with no opening 65. Consequently, the HDD 10 can delay occurrence of a short circuit between the pads 45 and 46.

The bottom wall 25 is provided with the hole 71 communicating with the opening 65. This allows setting of a further longer creepage distance DC between the pads 45 and 46. Consequently, the HDD 10 according to the present embodiment can delay occurrence of a short circuit between the pads 45 and 46.

The pad 46 is spaced from the pad 45 in the Y direction along the upper surface 35b. In the Y direction, the hole 71 is longer in length (width) than the opening 65. Because of this, the hole 71 (the recesses 77 and 78) is partially recessed from the edge 68a of the opening 65 in the Y direction. The creepage distance DC between the pads 45 and 46 is equal to or greater than the sum of twice the depth of the opening 65, the difference in length between the hole 71 and the opening 65 in the Y direction, twice the depth of the hole 71, and the length of the hole 71 in the Y direction. As such, the HDD 10 of the present embodiment can implement a further longer creepage distance DC between the pads 45 and 46, thereby delaying occurrence of a short circuit therebetween.

The organic compound layer 31 includes the adhesive layer 36 and the base layer 35. The adhesive layer 36 include the lower surface 36a of the organic compound layer 31. The base layer 35 include the upper surface 35b of the organic compound layer 31. In the Z direction orthogonal to the lower surface 36a, the length (depth) of the hole 71 is longer than the length (thickness) of the adhesive layer 36. As a result, the adhesive layer 36 does not reach the bottom of the hole 71, ensuring that a part (the recesses 77 and 78) of the hole 71 is recessed from the edge 68a of the opening 65 in the Y direction. In this manner, the HDD 10 of the present embodiment can implement a further longer creepage distance DC between the pads 45 and 46, thereby delaying occurrence of a short circuit.

The protrusion 79 protrudes from the bottom wall 25 through the opening 65. By inserting the protrusion 79 into the opening 65, for example, the external FPC 30 is guided to a predetermined position with respect to the bottom wall 25. That is, the opening 65 is used to increase the creepage distance DC between the pads 45 and 46 as well as to position the external FPC 30. Further, the protrusion 79 is apart from the edges 45a and 46a in the −X direction. The protrusion 79 can thus be prevented from interfering with the compression connector 91 contacting the pads 45 and 46.

Each of the pads 45 and 46 includes the metal layer 51 and the gold plating 52. The metal layer 51 is formed on the upper surface 35*b*. The gold plating 52 covers the metal layer 51. The metal layer 51 contains at least one of copper and nickel. Typically, copper and nickel are more easily ionized than gold. Furthermore, the gold plating 52 may have pinholes. For this reason, the metal layer 51 may be ionized earlier than the gold, and the ionized part may advance to the outside of the gold plating 52 through the pinholes. That is, the pads 45 and 46 including the metal layer 51 and the gold plating 52 may be subject to creep corrosion. However, the HDD 10 of the present embodiment allows setting of a longer creepage distance DC between the pads 45 and 46, leading to delaying occurrence of a short circuit therebetween.

The opening 65 also extends between the pad 45 and the wire 42. This also allows setting of a longer creepage distance between the pad 45 and the wire 42. As such, the HDD 10 according to the present embodiment can delay occurrence of a short circuit between the pad 45 and the wire 42 which may be caused by corroded metal due to creep corrosion on the pad 45.

The cover 100 is a tape attached to the external FPC 30 so as to cover at least one of the pads 45 and 46. As a result, at least one of the pads 45 and 46 is protected from, for example, a high-humidity environment and a corrosive gas. The HDD 10 of the present embodiment can thus prevent at least one of the pads 45 and 46 from being subject to creep corrosion.

The cover 100 may be a coating layer that is included in the external FPC 30 to cover at least one of the pads 45 and 46. In this case, at least one of the pads 45 and 46 is protected from, for example, a high-humidity environment and a corrosive gas. The HDD 10 of the present embodiment can thus prevent at least one of the pads 45 and 46 from being subject to creep corrosion.

The spindle motor 13 is electrically connected to the wires 41 and 42 and supplied with electric power through the wires 41 and 42. That is, the pads 45 and 46 are connected to the wires 41 and 42 through which electric power is supplied to the spindle motor 13. The HDD 10 according to the present embodiment can have an extended product lifetime by delaying occurrence of a short circuit between the pads 45 and 46.

Figure 7:
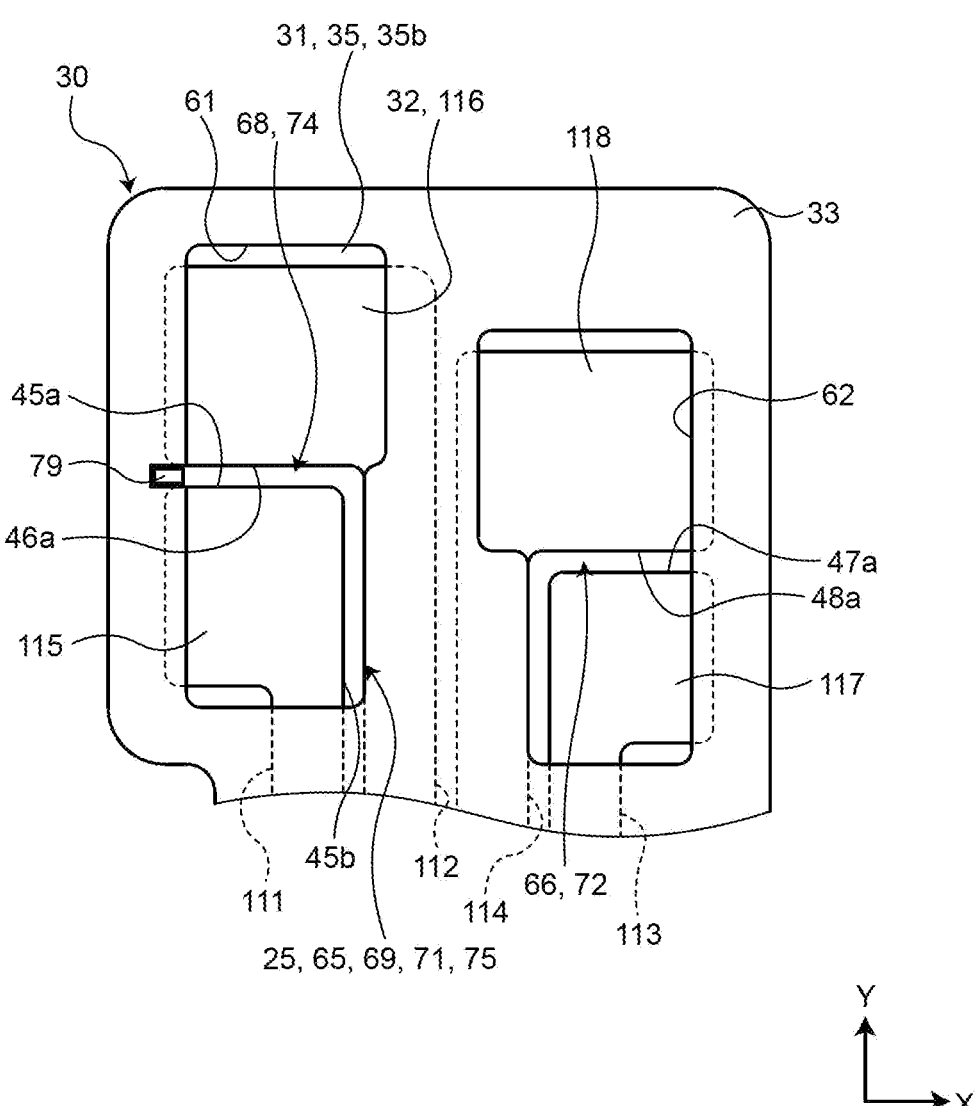
FIG. 7 is an exemplary plan view illustrating a part of an external FPC according to a first modification of the first embodiment.

FIG. 7 is an exemplary plan view illustrating a part of the external FPC 30 according to a first modification of the first embodiment. As illustrated in FIG. 7, the external FPC 30 may include pads 115, 116, 117, and 118 at the end of the wire 111, 112, 113, and 114. The wires 111, 112, 113, and 114 and the pads 115, 116, 117, and 118 are substantially the same as the wires 41, 42, 43, and 44 and the pads 45, 46, 47, and 48, except for the locations of the pads 115, 116, 117, and 118 at the ends of the wires 111, 112, 113, and 114. That is, the pads 45, 46, 47, 48, 115, 116, 117, and 118 may be provided in any portion of the wires 41, 42, 43, 44, 111, 112, 113, and 114.

Figure 8:
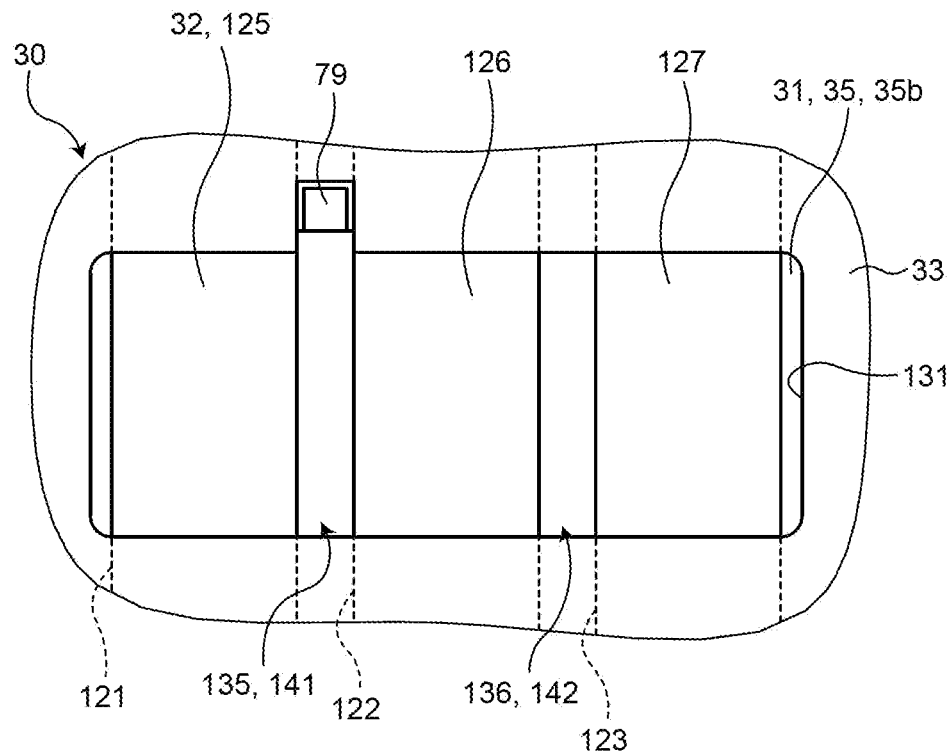
FIG. 8 is an exemplary plan view illustrating a part of an external FPC according to a second modification of the first embodiment.

FIG. 8 is an exemplary plan view illustrating a part of the external FPC 30 according to a second modification of the first embodiment. As illustrated in FIG. 8, the external FPC 30 may include wires 121, 122, and 123 and pads 125, 126, and 127, and may be provided with an exposure hole 131 and openings 135 and 136. The wires 121, 122, and 123, the pads 125, 126, and 127, the exposure hole 131, and the openings 135 and 136 are substantially the same as the wires 41, 42, and 43, the pads 45, 46, and 47, the exposure hole 61, and the opening 65, except for the points described below.

The three pads 125, 126, and 127 are arranged at intervals in the X direction. The pad 126 is located between the pads 125 and 127. The opening 135 extends between the pads 125 and 126. The opening 136 extends between the pads 126 and 127. The openings 135 and 136 communicate with holes 141 and 142 in the bottom wall 25, respectively. The holes 141 and 142 are substantially the same as the hole 71.

The exposure hole 131 exposes the three pads 125, 126, and 127 and the two openings 135 and 136 to the outside of the external FPC 30. That is, the exposure holes 61 and 131 provided in the cover layer 33 may expose three or more pads 125, 126, and 127 to the outside of the external FPC 30.

Second Embodiment

Hereinafter, a second embodiment will be described with reference to FIGS. 9 and 10. In the following description of the embodiment, components having functions similar to those of the components already described are denoted by the same reference numerals as those of the components already described, and the description thereof may be omitted. In addition, the plurality of components denoted by the same reference numerals do not necessarily have all the functions and properties in common, and may have different functions and properties according to each embodiment.

Figure 9:
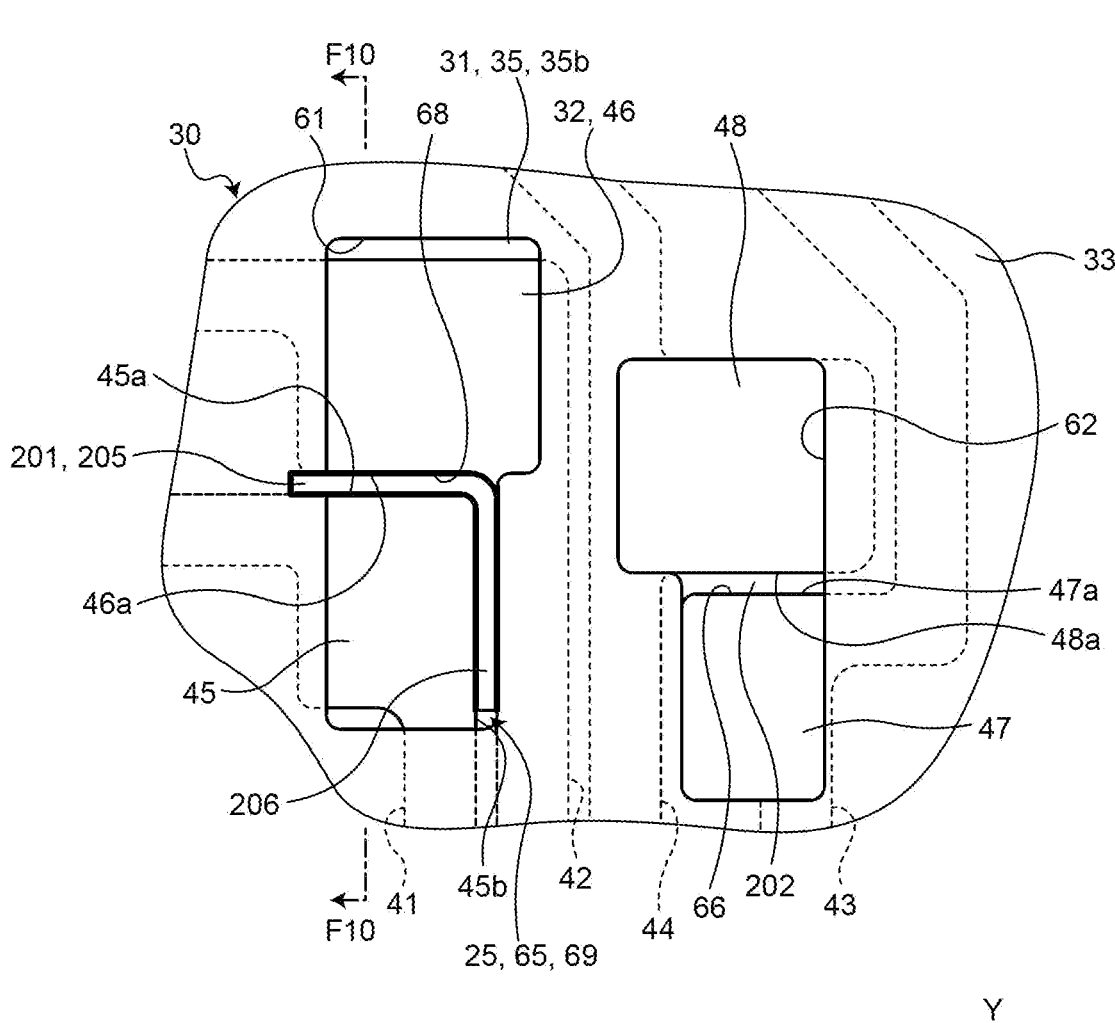
FIG. 9 is an exemplary plan view illustrating a part of an external FPC according to a second embodiment.
Figure 9:
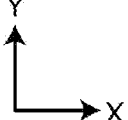

FIG. 9 is an exemplary plan view illustrating a part of the external FPC 30 according to the second embodiment. FIG. 10 is an exemplary cross-sectional view illustrating a part of the HDD 10 of the second embodiment along line F10-F10 of FIG. 9. As illustrated in FIG. 9, the bottom wall 25 of the second embodiment has protrusions 201 and 202 instead of the holes 71 and 72 and the protrusion 79. The protrusion 201 is an example of a second protrusion.

Figure 10:
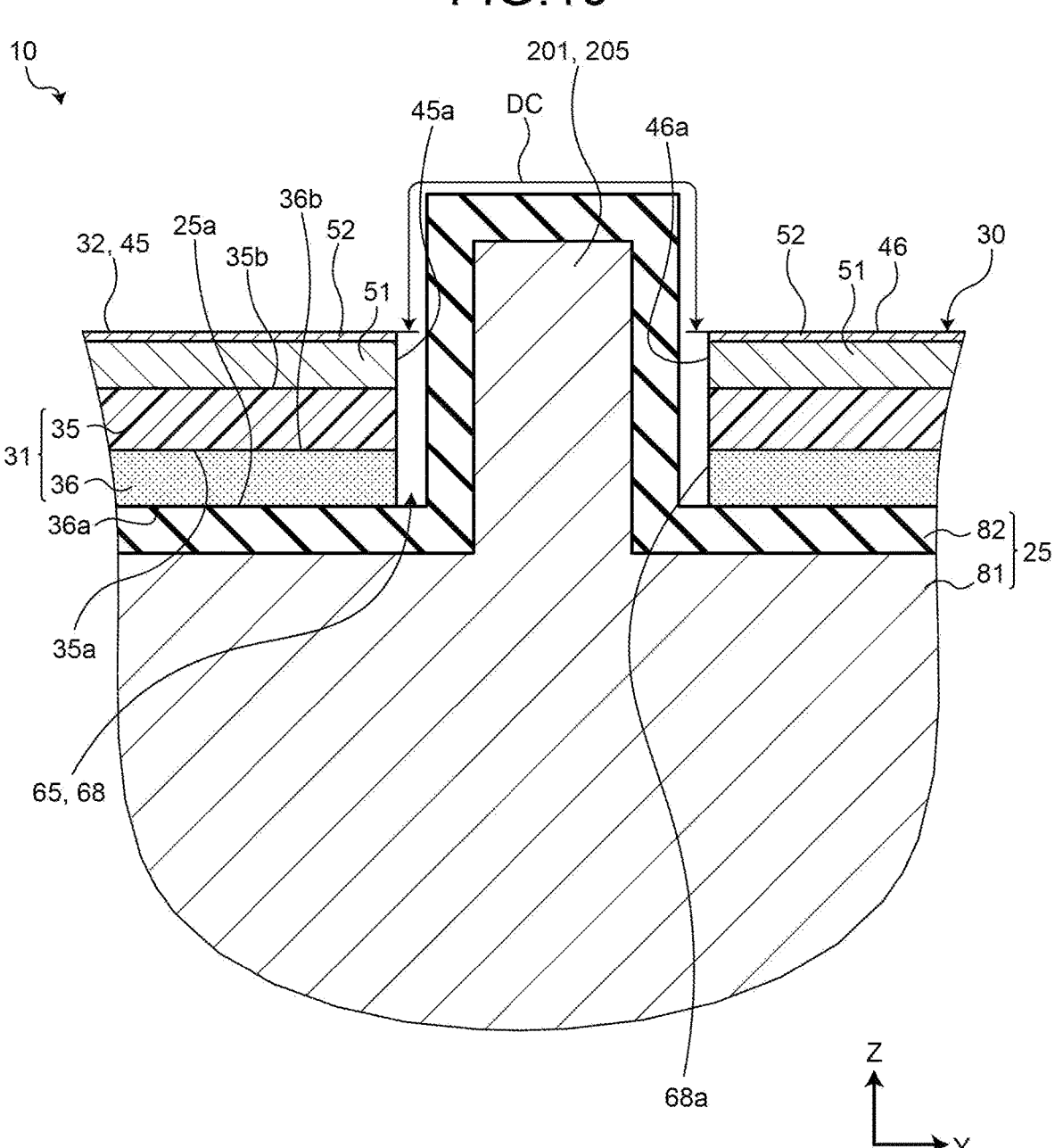
FIG. 10 is an exemplary cross-sectional view illustrating a part of the HDD of the second embodiment along line F10-F10 of FIG. 9.

As illustrated in FIG. 10, the protrusions 201 and 202 protrude substantially in the +Z direction from the outer surface 25*a* of the bottom wall 25. The protrusion 201 is inserted into the opening 65 of the organic compound layer 31. The protrusion 202 is inserted into the opening 66 of the organic compound layer 31.

In the Z direction, the length of each of the protrusions 201 and 202 is longer than the length (thickness) of the organic compound layer 31. Because of this, the protrusion 201 protrudes from the bottom wall 25 through the opening 65, penetrating the upper surface 35*b*. Further, the protrusion 202 protrudes from the bottom wall 25 through the opening 66, penetrating the upper surface 35*b*. In the Z direction, the protrusion 201 has a length twice or more the length (thickness) of the organic compound layer 31. The length of the protrusion 201 is, for example, about 100 μm. Note that the dimension of the protrusion 201 is not limited to this example.

As illustrated in FIG. 9, the protrusion 201 has a substantially L shape having two parts 205 and 206. A first part 205 extends between the pads 45 and 46. In the present embodiment, the first part 205 extends in the X direction between the entire edge 45*a* of the pad 45 and at least a part of the edge 46*a* of the pad 46. A second part 206 extends in the Y direction between at least a part of the edge 45*b* of the pad 45 and a part of the wire 42. The protrusion 202 extends between the edge 47*a* of the pad 47 and the edge 48*a* of the pad 48.

The insulating coating 82 on the base 21 forms the outer surfaces of the protrusions 201 and 202. Thus, the coating 82 can prevent short-circuiting between the base 21 and the pads 45, 46, 47, and 48 even when the protrusions 201 and 202 come into contact with the pads 45, 46, 47, and 48.

In the HDD 10 of the second embodiment described above, the protrusion 201 protrudes from the bottom wall 25 through the opening 65, penetrating the upper surface 35*b*. The protrusion 201 extends between the pads 45 and 46. Such a protrusion allows setting of a further longer creepage distance DC between the pads 45 and 46. In addition, the protrusion 201 penetrates the upper surface 35*b* to protrude, to be able to hinder the progress of corroded metal in-between the pads 45 and 46, if corrosion occurs. As such, the HDD 10 according to the present embodiment can delay occurrence of a short circuit between the pads 45 and 46. Furthermore, the protrusion 201 can serve to correctly position the external FPC 30 with respect to the bottom wall 25 during the assembly of the HDD 10, for example.

The protrusion 201 extends between the entire edge 45*a* and the edge 46*a*. Owing to such a protrusion, the HDD 10 according to the present embodiment can avoid a partial decrease in the creepage distance DC between the edge 45*a* and the edge 46, which would otherwise occur in the region with no protrusion 201, thereby delaying occurrence of a short circuit between the pads 45 and 46.

In the above description, "to prevent (to be prevented)" is defined as, for example, preventing the occurrence of an event, an action, or an influence, or reducing the degree of the event, the action, or the influence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a wall; and
a substrate with an opening, including
an organic compound layer,
a first surface of the organic compound layer, the first surface attached to the wall,
a second surface of the organic compound layer, the second surface opposite the first surface,
first wiring on the second surface,
second wiring on the second surface,
a first pad connected to the first wiring, and
a second pad connected to the second wiring away from the first pad, wherein the opening penetrates the organic compound layer to open to the first surface and the second surface between the first pad and the second pad, wherein
the first pad has a first edge extending in a first direction along the second surface and facing the second pad,
the second pad has a second edge extending in the first direction and facing the first edge, the opening extends between the entire first edge and at least a part of the second edge, and
the wall is provided with a hole communicating with the opening.

2. The electronic device according to claim 1, wherein
the substrate further includes a cover layer covering the second surface, the first wiring, and the second wiring, and
the cover layer is provided with an exposure hole from which the first pad, the second pad, and the opening are exposed to an outside of the substrate.

3. The electronic device according to claim 1, wherein
the second pad is spaced from the first pad in a second direction along the second surface, and
the hole is longer in length than the opening in the second direction.

4. The electronic device according to claim 3, wherein
the organic compound layer includes an adhesive layer having the first surface and an insulator layer having the second surface, and
the hole is longer in length than the adhesive layer in a third direction orthogonal to the first surface.

5. The electronic device according to claim 1, wherein
the first pad includes
a first metal layer formed on the second surface and connected to the first wiring, and
first gold plating covering the first metal layer,
the second pad includes
a second metal layer formed on the second surface and connected to the second wiring, and
second gold plating covering the second metal layer, and
each of the first metal layer and the second metal layer contains at least one of copper and nickel.

6. The electronic device according to claim 1, wherein
the opening extends between the first pad and the second wiring.

7. The electronic device according to claim 1, further comprising:
a tape attached to the substrate so as to cover at least one of the first pad and the second pad.

8. The electronic device according to claim 1, wherein
the substrate further includes a coating layer covering at least one of the first pad and the second pad.

9. The electronic device according to claim 1, further comprising:
an electric component electrically connected to the first wiring and the second wiring and supplied with electric power through the first wiring and the second wiring.

10. The electronic device according to claim 1, wherein
the substrate is a flexible printed circuit board.

11. The electronic device according to claim 1, further comprising:
a housing having the wall.

12. The electronic device according to claim 1, wherein
the opening is adjacent to the first pad and the second pad.

* * * * *